US006458647B1

(12) United States Patent
Tews et al.

(10) Patent No.: US 6,458,647 B1
(45) Date of Patent: Oct. 1, 2002

(54) PROCESS FLOW FOR SACRIFICIAL COLLAR WITH POLY MASK

(75) Inventors: Helmut Horst Tews, Unterhaching (DE); Stephan Kudelka, Fishkill, NY (US); Irene McStay, Hopewell Junction, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/940,761

(22) Filed: Aug. 27, 2001

(51) Int. Cl.[7] .......................................... H01L 21/8242
(52) U.S. Cl. ..................... 438/246; 438/243; 438/244; 438/386; 438/387; 438/389
(58) Field of Search ................................ 438/243–249, 438/386–392

(56) References Cited

U.S. PATENT DOCUMENTS

| 4,368,099 A | * | 1/1983 | Huggett et al. ......... 204/192.32 |
| 4,601,778 A | * | 7/1986 | Robb .................... 204/192.37 |
| 4,994,409 A | * | 2/1991 | Yoon et al. ................. 438/392 |
| 5,877,061 A | * | 3/1999 | Halle ......................... 438/243 |
| 5,959,325 A | * | 9/1999 | Adair et al. ................. 257/302 |
| 6,074,909 A | * | 6/2000 | Gruening et al. ........... 257/301 |
| 6,136,717 A | * | 10/2000 | Winnerl et al. ............. 438/279 |
| 6,143,599 A | * | 11/2000 | Kim et al. ................... 438/243 |
| 6,376,324 B1 | * | 4/2002 | Mandelman et al. ....... 257/301 |

OTHER PUBLICATIONS

U.S. Application No. US 2002/0068399 A1, Divakaruni et al. "Negative Ion implant Mask Formation For Self–Aligned Sublithographic Resolution Patterning For Single–sided Verticle Device Formation." Jun. 6, 2002.*

* cited by examiner

Primary Examiner—John F. Niebling
Assistant Examiner—Jennifer M. Kennedy
(74) Attorney, Agent, or Firm—Slater & Matsil, LLP

(57) ABSTRACT

A process for forming a sacrificial collar (116) on the top portion of a deep trench (114). A nitride layer (116) is deposited within the trench (114). A semiconductor layer (120) is deposited over the nitride layer (116). A top portion of the semiconductor layer (120) is doped to form doped semiconductor layer (124). Undoped portions (120) of the semiconductor layer are removed, and the doped semiconductor layer (124) is used to pattern the nitride layer (116), removing the lower portion of nitride layer (116) from within deep trenches (114) and leaving a sacrificial collar (116) at the top of the trenches (114).

27 Claims, 5 Drawing Sheets

PROCESS FLOW FOR SACRIFICIAL COLLAR WITH POLY MASK

TECHNICAL FIELD

The present invention relates generally to the fabrication of semiconductor integrated circuits (IC's), and more particularly to the fabrication of memory IC's.

BACKGROUND

Semiconductor devices are used in a variety of electronic applications, such as personal computers and cellular phones, for example. The semiconductor industry in general is being driven to decrease the size of semiconductor devices located on integrated circuits. Miniaturization is generally needed to accommodate the increasing density of circuits necessary for today's semiconductor products.

One semiconductor product widely used in electronic systems for storing data is a semiconductor memory device, and a common type of semiconductor memory device is a dynamic random access memory (DRAM). A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

More recent DRAM designs involve manufacturing storage capacitors that comprise deep trenches and an overlying transistor disposed over the deep trench storage cells formed in a subsequent layer. This type of DRAM structure is referred to as a vertical DRAM.

An interim structure often used in the formation of deep trench storage cells is a sacrificial collar. A sacrificial collar comprises a thin insulating collar layer that is formed at the top of a trench that is left remaining during trench processing, for example, during bottle etch and doping of semiconductor substrate within the deep trench. The sacrificial collar is removed prior to the completion of the semiconductor memory device, and is replaced by a permanent collar after the deep trench processing is completed.

SUMMARY OF THE INVENTION

Embodiments of the present invention achieve technical advantages as a process flow for a sacrificial collar scheme for a trench in a semiconductor device, such as a DRAM. A semiconductor layer is deposited and used as a mask, by doping the top portion of the semiconductor layer within the trench. The undoped layer of semiconductor material is removed, and the doped semiconductor material acts as a mask for the underlying nitride layer which is etched to form a sacrificial collar in accordance with an embodiment of the invention.

Disclosed is a method of manufacturing a semiconductor device, comprising providing a semiconductor substrate, depositing a first material layer over the substrate, and depositing a semiconductor layer over the first material layer. The method includes doping a portion of the semiconductor layer, leaving undoped semiconductor layer portions and creating doped semiconductor layer portions, and removing the undoped semiconductor layer portion. The method also includes removing portions of the first material layer, using the doped semiconductor layer portion as a mask, and removing the doped semiconductor layer portion.

Also disclosed is a method of forming a sacrificial collar in a semiconductor device having a plurality of trenches formed in a substrate, the method comprised of depositing a first nitride layer over the substrate, depositing a semiconductor layer over the first nitride layer, and doping a top portion of the semiconductor layer within the trenches, leaving undoped semiconductor layer portions in the bottom of the trenches. The method includes removing the undoped semiconductor layer portion from the trench bottoms, removing portions of the first nitride layer from the trench bottoms, using the doped semiconductor layer portion as a mask, and leaving portions of the first nitride layer at the top of the trenches to form a sacrificial collar. The doped semiconductor layer portion is removed.

In another embodiment, disclosed is a method of forming a sacrificial collar in a semiconductor device having a plurality of trenches formed in a substrate, the trenches having sidewalls. The method comprises forming a first oxide layer on the trench sidewalls, depositing a first nitride layer over the first oxide layer, depositing a semiconductor layer over the first nitride layer, and doping a top portion of the semiconductor layer within the trenches, leaving undoped semiconductor layer portions in the bottom of the trenches. The method includes removing the undoped semiconductor layer portion from the trench bottoms, removing portions of the first nitride layer from the trench bottoms, using the doped semiconductor layer portion as a mask, leaving portions of the first nitride layer at the top of the trenches to form a sacrificial collar, removing the first oxide layer at the bottom part of the trenches, and removing the doped semiconductor layer portion.

Further disclosed is a method of forming a sacrificial collar in a semiconductor device having a plurality of trenches formed in a substrate, the method comprising depositing a first nitride layer over the substrate, depositing a semiconductor layer over the first nitride layer, depositing a second nitride layer over the semiconductor layer, and removing a top portion of the second nitride layer within the trenches to leave a bottom portion of the second nitride layer within the trenches and leave a top portion of the semiconductor layer portion exposed. The method includes doping the semiconductor layer top portion within the trenches, leaving undoped semiconductor layer portions in the bottom of the trenches, removing the bottom portion of the second nitride layer, and removing the undoped semiconductor layer portion from the trench bottoms. Portions of the first nitride layer are removed from the trench bottoms, using the doped semiconductor layer portion as a mask, leaving portions of the first nitride layer at the top of the trenches to form a sacrificial collar, and the doped semiconductor layer portion is removed.

Advantages of embodiments of the invention include providing the ability to form a sacrificial collar without requiring the use of a polysilicon fill within the deep trenches, which polysilicon is difficult to remove and may cause problems in semiconductor processing by forming black silicon and causing increased particulates in wafer fabrication equipment, as examples. Rather than using a polysilicon trench fill as in prior art sacrificial collar processes, a resist fill is used to mask the semiconductor layer while the upper portion of the semiconductor layer is doped. The resist is removed, and the undoped of the semiconductor layer is removed. The remaining doped polysilicon layer acts as a mask for the formation of the sacrificial collar in accordance with an embodiment of the present invention.

In an alternative embodiment, a first nitride layer is deposited over the semiconductor layer, and the nitride is used as a mask, so that high temperature gas phase doping may be used to dope the semiconductor layer which is then used as a mask for the underlying first nitride layer.

The sacrificial collar thickness may be well controlled because it is preferably formed in a deposition process. Advantageously, thicker sacrificial collars may be formed than in prior art processes in which sacrificial collars are formed by nitridation.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A prior art process flow for forming a sacrificial collar will be discussed, followed by a description of some exemplary embodiments of the present invention and a discussion of some advantages thereof. A cross-section of one memory cell is shown in each figure, although many other memory cells and components of memory cells are present in the semiconductor devices shown.

Figure 1:
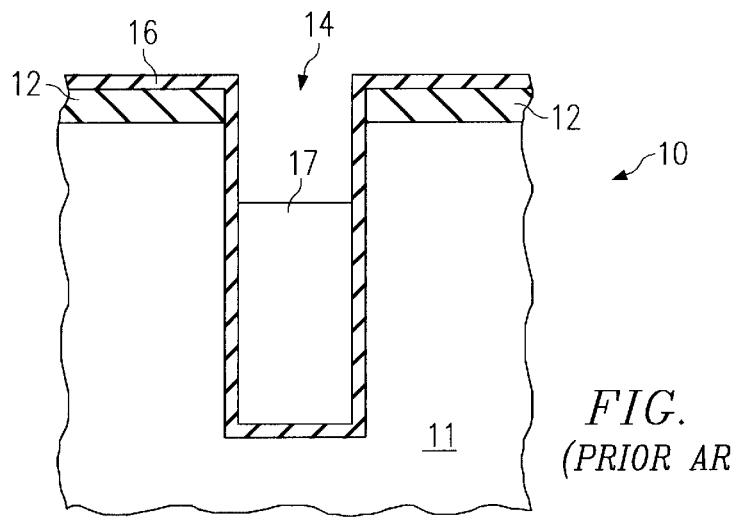
FIGS. 1 and 2 illustrate cross-sectional views of a prior art sacrificial collar manufacturing process flow.
Figure 2:
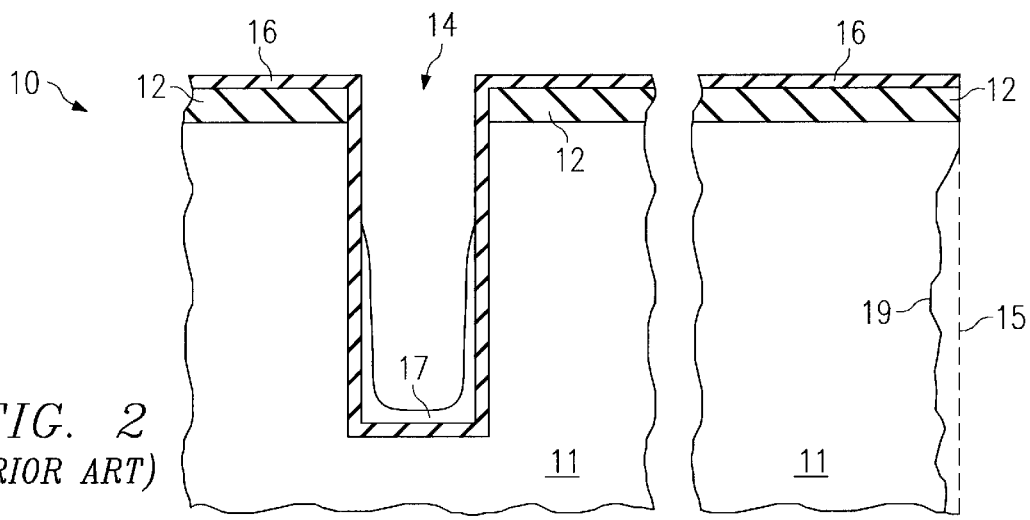

FIGS. 1 and 2 illustrate cross-sectional views of a prior art method of forming a sacrificial collar in a DRAM cell. A wafer 10 comprising a substrate 11 is provided. A pad nitride 12 is formed over the substrate 11. The pad nitride 12 may comprise silicon nitride, for example. An optional oxide layer maybe deposited below the pad nitride 12 to reduce stress effects. Trenches 14 are formed within the substrate 11 and the pad nitride 12. A thin first nitride layer 16 is deposited over the substrate 11 and pad nitride 12. A semiconductor material 17, typically comprising polysilicon, is deposited over the wafer 10. The polysilicon 17 is etched back within the trenches 14 to a predetermined height below the top of the substrate 11 surface.

A problem with the prior art process described for FIG. 1 is that the polysilicon 17 is difficult to remove within the deep trenches 14, as shown in FIG. 2. To remove the polysilicon 17, a very lengthy etch procedure with high concentrations of etchant chemicals is required, which is detrimental to the wafer 10 because a highly concentrated etch may damage the wafer substrate 11 on the edges 15 of the wafer 10, as shown in damaged regions 19 in FIG. 2. Damaged regions 19 of the wafer sides 15 are often referred to in the art as black silicon. Black silicon 19 is very damaging in a wafer 10 fabrication process, because particulates are created that damage wafers 10 and leave particulates in the wafer processing equipment, which can subsequently cause damage to other wafers processed in the equipment. Furthermore, it is very difficult to remove all of the polysilicon 17 from the bottom of the trenches 14, as shown in FIG. 2.

Embodiments of the present invention provide technical advantages as a process flow for forming a sacrificial collar in a deep trench of a memory cell. FIGS. 3–10 show cross-sectional views of a wafer 100 in various stages of manufacturing in accordance with an embodiment of the present invention.

Figure 3:
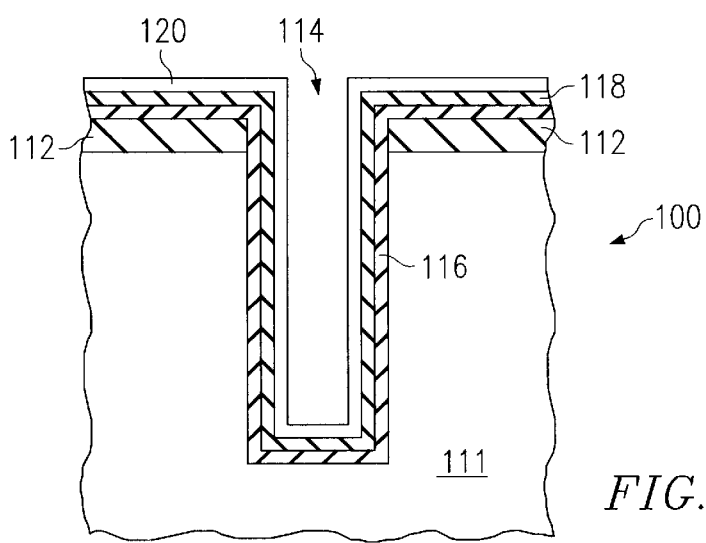
FIGS. 3–10 illustrate cross-sectional views of a semiconductor device at various stages of fabrication in accordance with an embodiment of the present invention, a process flow for forming a sacrificial collar.

As shown in FIG. 3, a wafer 100 is provided having a substrate 111. The substrate 111 typically comprises a semiconductor material such as single-crystal silicon, and may include other conductive layers or other semiconductor elements such as transistors or diodes, as examples. The substrate 111 may alternatively comprise compound semiconductors such as GaAs, InP, Si/Ge, SiC, as examples.

Figure 5:
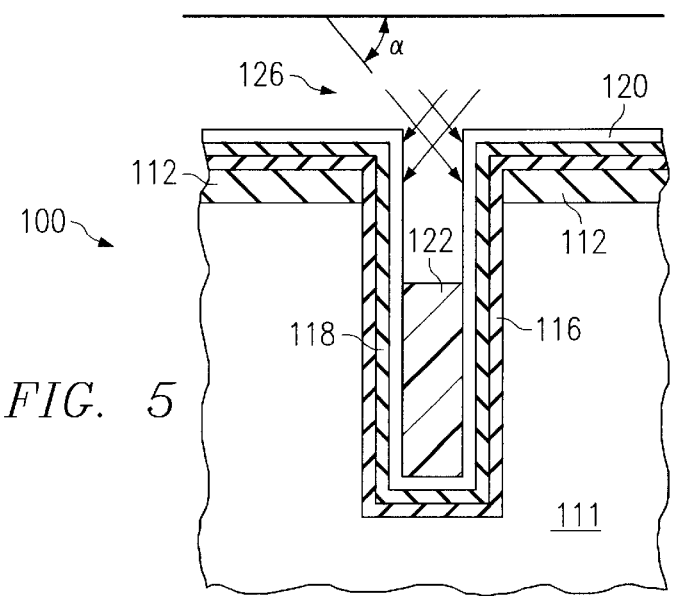

A pad nitride 112 is deposited over the substrate 111. The pad nitride 112 may comprise silicon nitride deposited in a thickness of about 100–300 nm, for example, and alternatively, pad nitride 112 may comprise other nitrides. An optional oxide layer maybe deposited below the pad nitride 12 to reduce stress effects. The wafer 100 is patterned using conventional lithography techniques and etched to form deep trenches 114 in substrate 111 and pad nitride 112, as shown in FIG. 5. Deep trenches 114 may be about 10 $\mu$m deep and 100 nm in diameter wide, as examples, although these parameters are a function of the ground rules for the particular device being manufactured.

A first nitride layer 116 is deposited over the pad nitride 112 and substrate 111, as shown. First nitride layer 116 preferably comprises about 50–100 Å of silicon nitride or $Si_3N_4$, for example. First nitride layer 116 may alternatively comprise other nitrides, for example.

An oxide layer 118 is deposited over the first nitride layer 116. The oxide layer 118 preferably comprises silicon dioxide, and may alternatively comprise other oxides, for example. Oxide layer 118 may be deposited by chemical vapor deposition (CVD), and alternatively, oxide layer 118 may be formed by oxidizing the top surface of the first nitride layer 116, as examples. Preferably, the oxide layer 118 comprises a thickness of about 20–40 Å, for example.

A semiconductor layer 120 is deposited over oxide layer 118. Semiconductor layer 120 preferably comprises silicon, for example, and may also comprise other semiconductor materials. Preferably, semiconductor layer 120 comprises amorphous silicon deposited substantially uniformly and conformally at a low temperature. Later in the processing of the wafer 100, the semiconductor layer 120 crystallizes, when the wafer 100 is exposed to the higher temperatures used during subsequent layer depositions. Alternatively, semiconductor layer 120 comprises polycrystalline silicon (polysilicon). Preferably, semiconductor layer 120 is conformal and comprises a thickness of about 50–200 Å. The semiconductor layer 120 may be deposited, for example, at about 500 degrees C.

Figure 4:
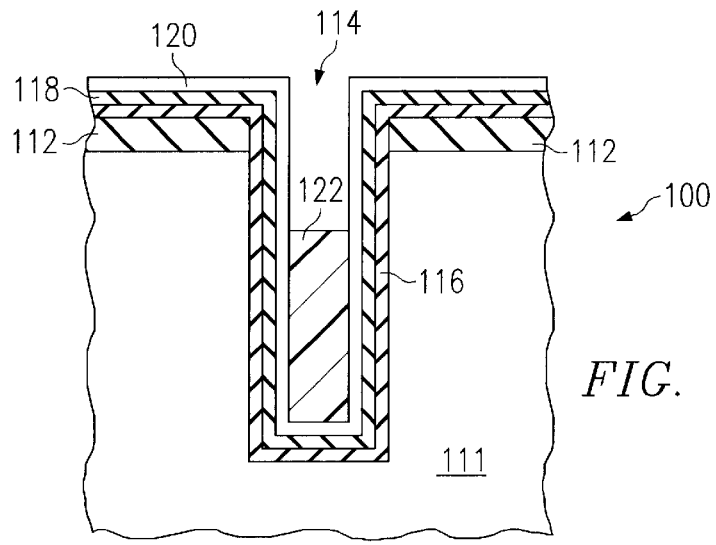

The wafer 100 is covered with resist 122 to fill the trenches 114, as shown in FIG. 4. The resist 122 is recessed within the trenches 114 to a predetermined height below the top surface of the substrate 111, for example, about 1 $\mu$m below the top surface of the substrate 111.

With the resist 122 remaining in place within the trenches 114, the wafer 100 is exposed to a dopant ion implantation 126 process. Preferably, the dopant implantation 126 is performed at a high dose and low energy, with the implantation depth preferably being less than about 100 Å and the surface doping preferably being greater than about 1e19 cm$^{-3}$, as examples. For example, a semiconductor implantation may be used for the doping of the exposed semiconductor layer 120, and alternatively, dopant ion implantation at an angle may be utilized. For example, the dopant implantation 126 may be performed at an angle of around 10 to 30 degrees with respect to the horizontal position of the wafer 100 at an energy of about 1–5 keV at a dose of about 1e14 to 1e15 cm$^{-2}$. Preferred dopants include boron or BF$_2$, arsenic, or phosphorus, as examples. Preferably, in the dopant implantation 126 process, the sidewalls of trenches 114 are doped, which trench sidewall doping may be accomplished by doping at an angle, to insure that the semiconductor material 120 on the sidewalls of the trenches 114 is sufficiently doped. Alternatively, the exposed semiconductor layer 120 may be doped by plasma implantation, for example.

Figure 6:
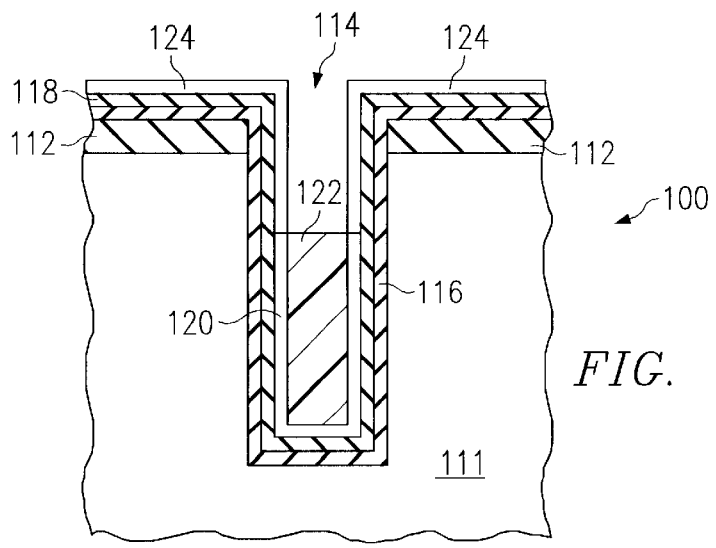

The doped portion 124 of semiconductor layer 120 forms a mask that will be used to form the sacrificial collar in accordance with an embodiment of the invention, as shown in FIG. 6.

Figure 7:
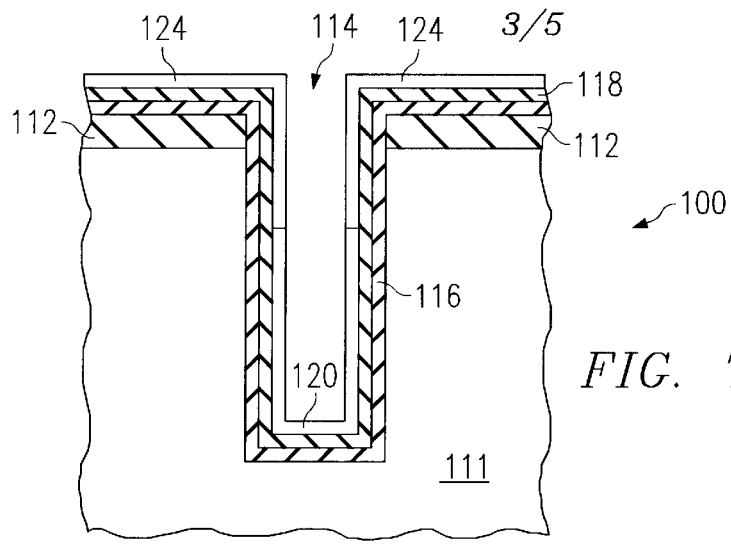
Figure 8:
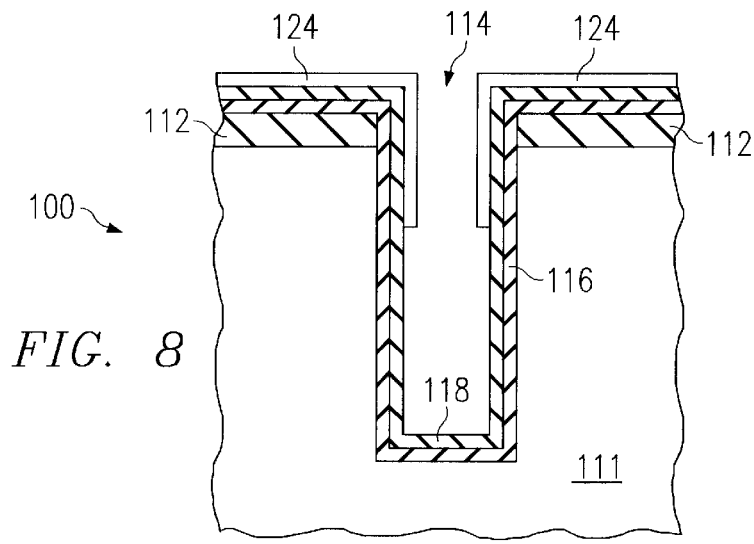

Shown in FIG. 7, the resist 122 within the trenches 114 is removed, leaving doped portions of semiconductor layer 124 at the top residing over the surface of the wafer 100 and along the sidewalls of the trenches 114 at the top. Undoped semiconductor layer 120 remains residing within the trenches 114.

The wafer 100 is exposed to an etch process, preferably an etch selective to the doped semiconductor material 124, for example, to remove the undoped semiconductor layer 120 at the bottom of the trenches 114. For example, if polysilicon is used for semiconductor layer 120, a wet polysilicon etch selective to doped polysilicon may be used. Thus, the undoped semiconductor layer 120 is removed, leaving the structure shown in FIG. 8.

Figure 9:
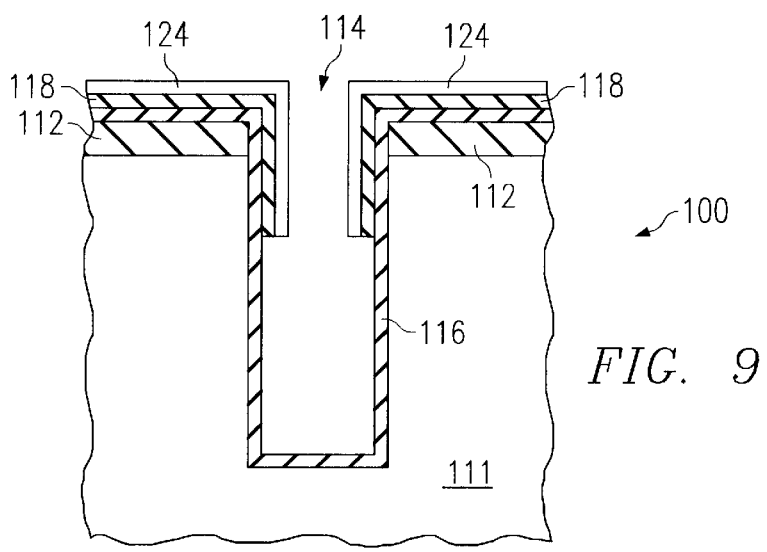

The wafer 100 is exposed to an oxide etch, e.g., preferably an oxide etch selective to nitride, to remove oxide layer 118 residing within the bottom of the trenches 114, as shown in FIG. 9.

Figure 10:
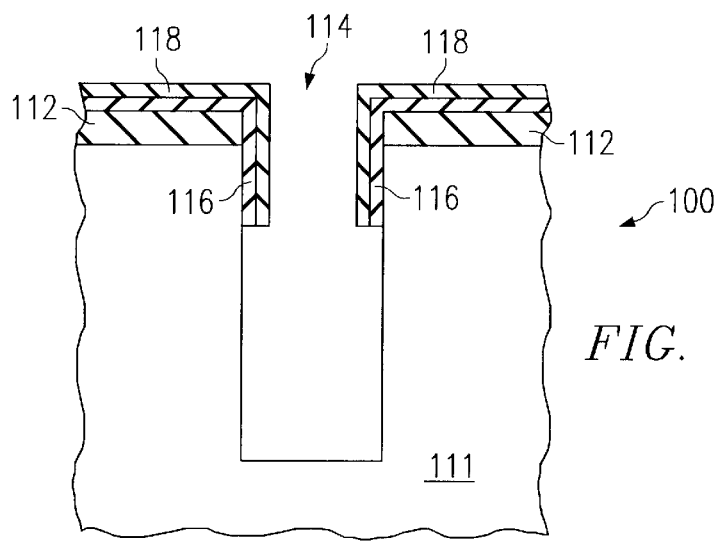

The wafer 100 is exposed to a doped semiconductor material 124 etch to remove the doped semiconductor material 124 from the top of the wafer 100 and the top sidewalls of the trenches 114, as shown in FIG. 10. Alternatively, a thermal oxidation may be performed to transform the doped semiconductor layer 124 into an oxide, followed by an oxide etch step. In this embodiment, the first nitride layer 116 protects the bottom part of the trenches 114 from oxidation.

The wafer 100 is then exposed to a nitride etch selective to oxide to remove the first nitride layer 116 from the bottom of the trenches 114, also shown in FIG. 10. The wafer 100 may then be subjected to subsequent processing steps of the deep trenches 114, such as the removal of the remaining oxide layer 118, and bottle etching and buried plate doping, as examples. Advantageously, nitride layer 116 comprises a sacrificial collar in accordance with an embodiment of the present invention.

An alternative embodiment of the present invention includes disposing an additional thin oxide layer (not shown) below the nitride layer 116. The processing sequence is otherwise unchanged from the scheme depicted in FIGS. 3–10. An additional oxide etch step is required thereafter to expose the silicon sidewall in the bottom part of the trenches 114. An advantage of using this additional thin oxide layer is the ability to perform cleaning steps after the first nitride layer 116 etch. The additional thin oxide layer prevents metal impurities being left on the silicon surface e.g., within the trenches 114 after the first nitride layer 116 etch.

Figure 11:
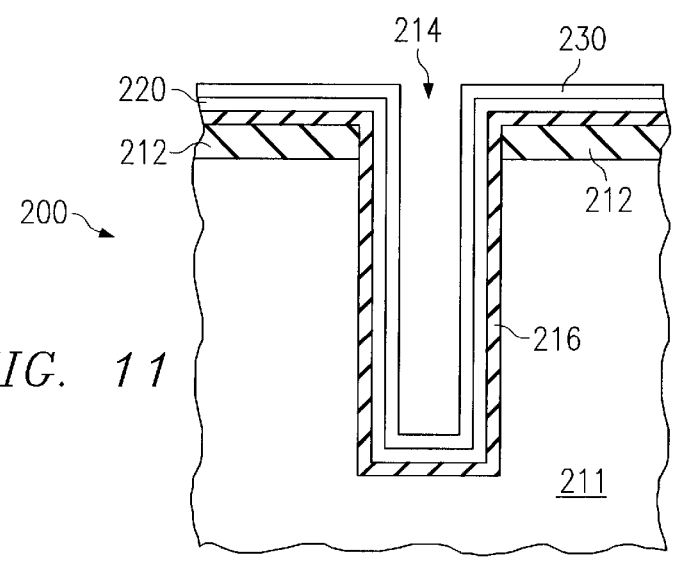
FIGS. 11–15 illustrate cross-sectional views of another embodiment of the present invention at various stages of fabrication.

An alternative embodiment of the present invention is depicted in cross-sectional view in FIGS. 11–14. A semiconductor wafer 200 is provided, the wafer 200 comprising a semiconductor substrate 211. A pad nitride 212 is deposited over the substrate 211, an optional oxide layer may be deposited below the pad nitride 12, and deep trenches 214 are formed within the pad nitride 212 and semiconductor substrate 211, as shown in FIG. 11.

A first nitride layer 216 is deposited over the wafer 200. The first nitride layer 216 preferably comprises silicon nitride and may alternatively comprise other nitrides, for example. The first nitride layer 216 preferably comprises about 50–100 Å of nitride material.

A semiconductor material 220 is deposited over the first nitride layer 216. Preferably, the semiconductor material 220 comprises thin intrinsic polysilicon comprising about 50–200 Å of material deposited in a conformal deposition at, for example, 500 degrees C.

A second nitride layer 230 is deposited over the semiconductor layer 220, as shown in FIG. 11. Preferably, second nitride layer 230 comprises about 50–100 Å of silicon nitride, for example, although other nitrides may be used.

Figure 12:
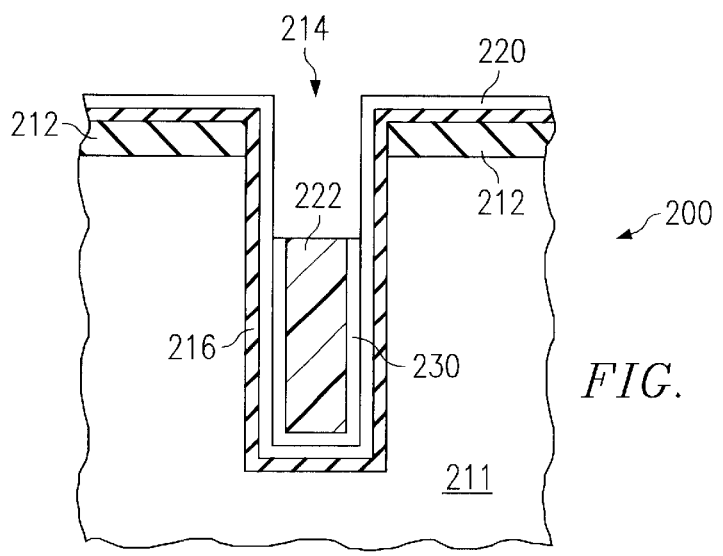

A resist 222 is deposited over the wafer 200, as shown in FIG. 12, to fill the trenches 214. The resist is recessed back to a level below the top surface of the substrate 211 of about 1 μm, for example. The second nitride layer 230 is etched from the top surface of the wafer 200 and from the top of the trenches 214.

Figure 13:
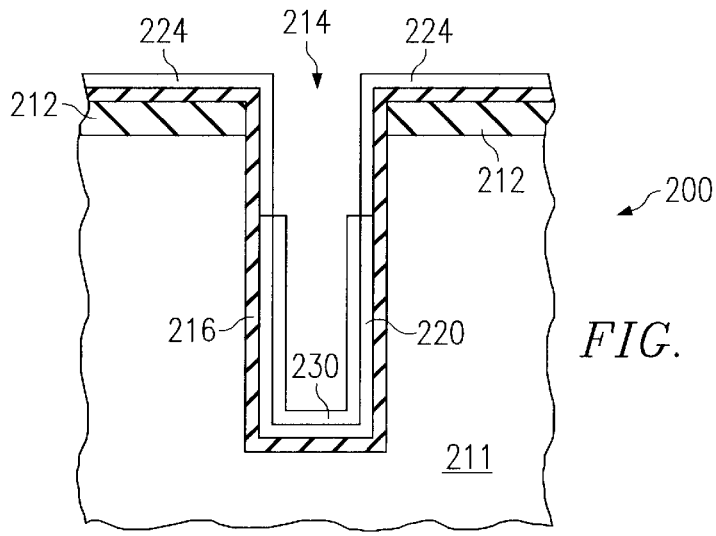

The resist 222 is removed from within the trenches 214, as shown in FIG. 13. The wafer 200 is exposed to a gas phase doping process in order to dope the exposed surfaces of the semiconductor layer 220 and form doped semiconductor layer 224 at the top of the trenches 214 and over the top surface of the wafer 200. Preferably, the gas phase doping process comprises exposing the wafer to diborane at a temperature of 900 to 1100 degrees C. for approximately 10 minutes, as examples. Alternatively, chemistries such as arsine or phosphine may be used for the gas phase doping, as examples. Using gas phase doping achieves high dose doping of the exposed semiconductor layer.

Figure 14:
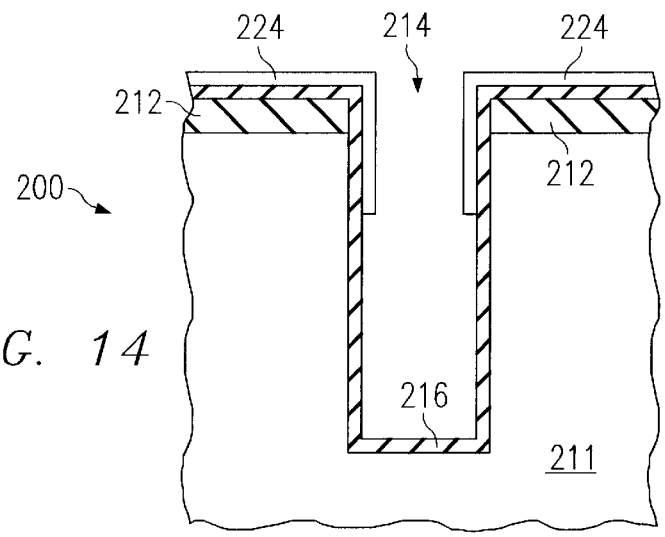
Figure 15:
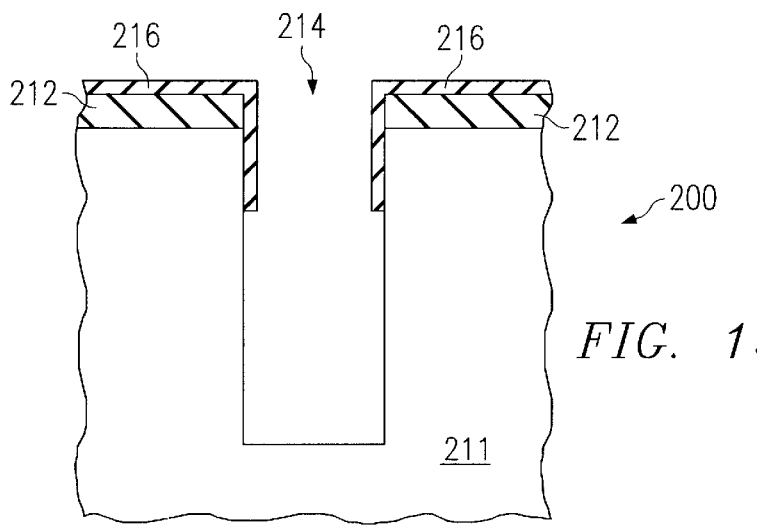

The wafer 200 is exposed to a nitride etch to remove the second nitride layer 230 from the bottom of the trenches 214, as shown in FIG. 14. The wafer 200 is then exposed to an undoped semiconductor layer 220 etch to removed the undoped semiconductor layer 220 from the bottom of the trenches 214. The first nitride layer 216 is removed from within the trenches 214, and the doped semiconductor material 224 is removed from the top of the trenches 214 and the top of the wafer 200, leaving first nitride layer 216 residing at the top of the trenches 214, as shown in FIG. 15. Advantageously, nitride layer 216 comprises a sacrificial collar in accordance with an embodiment of the present invention.

The embodiments shown in FIGS. 11 to 15 are advantageous in that a high temperature gas phase doping process may be used to dope the semiconductor layer 220, which is not possible if the resist 222 remains on the wafer during the semiconductor material doping process, as in the first embodiment described herein.

While embodiments of the present invention are described herein with reference to a DRAM, they also have useful application in ferroelectric random access memory (FRAM) devices and other semiconductor devices. For example, other semiconductor devices having topographies with trench-like or stack-like features may benefit from the manufacturing processes described herein. Semiconductors with substantially flat topographies also benefit from embodiments of the present invention.

Semiconductor material 120/220 may be selectively doped, and the undoped portions subsequently removed, as described herein, such that the doped semiconductor material 124/224 acts as a mask for an underlying material layer such as first nitride layer 116/216. Although first nitride layer 116/216 is described herein as preferably comprising a nitride, first nitride layer 116/216 may alternatively comprise other materials, such as oxides, other insulators, and conductive materials, as examples.

Embodiments of the present invention provide several advantages over prior art processes to form sacrificial collars of deep trenches of memory cells. First, a resist 122/222 is used to pattern the sacrificial collars 116/216, which resist 122/222 is easily removed from within the deep trenches 114/214. This advantageous over prior art processes that utilized polysilicon to pattern the sacrificial collars, which was hard to remove from the deep trenches 14 and caused black silicon 19 to occur. A high temperature gas phase doping process may be used in accordance with an embodiment of the present invention to dope the semiconductor layer 220. Furthermore, the sacrificial collar 116/216 thickness may be well-controlled because it is preferably formed in deposition process. Advantageously, thicker sacrificial collars 116/216 may be formed than in prior art processes in which sacrificial collars are formed by nitridation.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a semiconductor device, comprising:
   providing a semiconductor substrate;
   forming a plurality of trenches in the semiconductor substrate;
   depositing a first material layer over the substrate;
   depositing a semiconductor layer over the first material layer;
   doping a top portion of the semiconductor layer, leaving undoped semiconductor layer portions in the bottom of the trenches and creating doped semiconductor layer portions in the top of the trenches;
   removing the undoped semiconductor layer portion;
   removing portions of the first material layer using the doped semiconductor layer portion as a mask, leaving portions of the first material layer at the top of the trenches; and
   removing the doped semiconductor layer portion, wherein the remaining first material layer portions comprise a sacrificial collar.

2. The method according to claim 1, wherein the first material layer comprises a first nitride layer.

3. The method according to claim 1, wherein depositing a semiconductor layer comprises depositing 50 to 200 Angstroms of amorphous or polycrystalline silicon.

4. The method according to claim 1, further comprising:
   depositing a resist over the semiconductor layer; and
   removing a portion of the resist so that the resist is recessed below a top surface of the substrate.

5. The method according to claim 4, wherein doping the semiconductor layer portion comprises exposing the wafer to a dopant ion implantation at a predetermined angle.

6. The method according to claim 5, wherein the predetermined angle comprises around 10 to 30 degrees.

7. The method according to claim 3, wherein doping the semiconductor layer portion comprises exposing the wafer to a plasma implantation process.

8. The method according to claim 2, further comprising:
   depositing a second nitride layer over the semiconductor layer, after depositing a semiconductor layer; and
   removing a portion of the second nitride layer, before doping a portion of the semiconductor layer.

9. The method according to claim 8, further comprising:
   forming a plurality of trenches in the semiconductor substrate, wherein removing a portion of the second nitride layer comprises removing the second nitride layer from a top portion of the trenches, wherein doping a portion of the semiconductor layer comprises doping a top portion of the semiconductor layer, leaving undoped semiconductor layer portions in the bottom of the trenches and doped semiconductor layer portions in the top of the trenches, wherein removing portions of the first nitride layer comprises leaving portions of the first nitride layer at the top of the trenches, the remaining first nitride layer portions comprising a sacrificial collar.

10. The method according to claim 9, wherein depositing a semiconductor layer comprises depositing 50 to 200 Angstroms of polysilicon.

11. The method according to claim 10, further comprising:
    depositing a resist over the second nitride layer, after depositing the second nitride layer; and
    removing a portion of the resist so that the resist is recessed below a top surface of the substrate.

12. The method according to claim 11, wherein doping the semiconductor layer portion comprises exposing the wafer to a gas phase doping process.

13. The method according to claim 2, further comprising:
    depositing an oxide layer over the first nitride layer, after depositing a first nitride layer; and
    removing portions of the oxide layer, using the doped semiconductor layer portions as a mask, after removing the undoped semiconductor layer portions.

14. A method of forming a sacrificial collar in a semiconductor device having a plurality of trenches formed in a substrate, the method comprising:
    depositing a first nitride layer over the substrate;
    depositing a semiconductor layer over the first nitride layer;
    doping a top portion of the semiconductor layer within the trenches, leaving undoped semiconductor layer portions in the bottom of the trenches;
    removing the undoped semiconductor layer portion from the trench bottoms;

removing portions of the first nitride layer from the trench bottoms, using the doped semiconductor layer portion as a mask, leaving portions of the first nitride layer at the top of the trenches to form a sacrificial collar; and removing the doped semiconductor layer portion.

15. The method according to claim 14, wherein depositing a semiconductor layer comprises depositing 50 to 200 Angstroms of amorphous or polycrystalline silicon.

16. The method according to claim 15, further comprising:

depositing a resist over the semiconductor layer, after depositing the semiconductor layer;

removing a portion of the resist so that the resist is recessed below a top surface of the substrate, prior to doping the semiconductor layer top portion; and removing the resist, after doping the semiconductor layer top portion.

17. The method according to claim 16, wherein doping the semiconductor layer top portion comprises exposing the wafer to a dopant implantation at a predetermined angle.

18. The method according to claim 14, further comprising:

depositing an oxide layer over the first nitride layer, after depositing a first nitride layer; and removing portions of the oxide layer, using the doped semiconductor layer portions as a mask, after removing the undoped semiconductor layer portions.

19. A method of forming a sacrificial collar in a semiconductor device having a plurality of trenches formed in a substrate, the trenches having sidewalls, the method comprising:

forming a first oxide layer on the trench sidewalls;

depositing a first nitride layer over the first oxide layer;

depositing a semiconductor layer over the first nitride layer;

doping a top portion of the semiconductor layer within the trenches, leaving undoped semiconductor layer portions in the bottom of the trenches;

removing the undoped semiconductor layer portion from the trench bottoms;

removing portions of the first nitride layer from the trench bottoms, using the doped semiconductor layer portion as a mask, leaving portions of the first nitride layer at the top of the trenches to form a sacrificial collar;

removing the first oxide layer at the bottom part of the trenches; and removing the doped semiconductor layer portion.

20. The method according to claim 19, wherein depositing a semiconductor layer comprises depositing 50 to 200 Angstroms of amorphous or polycrystalline silicon.

21. The method according to claim 20, further comprising:

depositing a resist over the semiconductor layer, after depositing the semiconductor layer;

removing a portion of the resist so that the resist is recessed below a top surface of the substrate, prior to doping the semiconductor layer top portion; and removing the resist, after doping the semiconductor layer top portion.

22. The method according to claim 21, wherein doping the semiconductor layer top portion comprises exposing the wafer to a dopant implantation at a predetermined angle.

23. A method of forming a sacrificial collar in a semiconductor device having a plurality of trenches formed in a substrate, the method comprising:

depositing a first nitride layer over the substrate;

depositing a semiconductor layer over the first nitride layer;

depositing a second nitride layer over the semiconductor layer;

removing a top portion of the second nitride layer within the trenches to leave a bottom portion of the second nitride layer within the trenches and leave a top portion of the semiconductor layer portion exposed;

doping the semiconductor layer top portion within the trenches, leaving undoped semiconductor layer portions in the bottom of the trenches;

removing the bottom portion of the second nitride layer;

removing the undoped semiconductor layer portion from the trench bottoms;

removing portions of the first nitride layer from the trench bottoms, using the doped semiconductor layer portion as a mask, leaving portions of the first nitride layer at the top of the trenches to form a sacrificial collar; and removing the doped semiconductor layer portion.

24. The method according to claim 23, wherein depositing a semiconductor layer comprises depositing 50 to 200 Angstroms of amorphous or polycrystalline silicon.

25. The method according to claim 23, further comprising:

depositing a resist over the second first nitride layer, after depositing the second first nitride layer; and removing a portion of the resist so that the resist is recessed below a top surface of the substrate.

26. The method according to claim 25, wherein doping the semiconductor layer portion comprises exposing the wafer to a gas phase doping process.

27. The method according to claim 23, further comprising:

depositing an oxide layer over the first nitride layer, after depositing a first nitride layer; and removing portions of the oxide layer, using the doped semiconductor layer portions as a mask, after removing the undoped semiconductor layer portions.

* * * * *